United States Patent [19]

Schultz et al.

[11] Patent Number: 4,743,873
[45] Date of Patent: May 10, 1988

[54] HIGHPASS FILTER OF A FILTER ARRANGEMENT FOR A THREE-PHASE NETWORK CONNECTED TO CONVERTERS

[75] Inventors: Walter Schultz, Kleinsendelbach; Ute Touchy; Kurt Krüger, both of Erlangen, all of Fed. Rep. of Germany

[73] Assignee: Siemens Aktiengesellschaft, Berlin and Munich, Fed. Rep. of Germany

[21] Appl. No.: 919,196

[22] Filed: Oct. 15, 1986

[30] Foreign Application Priority Data

Nov. 11, 1985 [DE] Fed. Rep. of Germany ....... 3539950

[51] Int. Cl.⁴ .............................................. H03H 7/06
[52] U.S. Cl. ..................................... 333/175; 333/12; 333/167; 333/176
[58] Field of Search ................................ 333/167–172, 333/174–177, 181–185, 12; 322/58, 78; 363/39, 40, 42, 44, 45, 47

[56] References Cited

U.S. PATENT DOCUMENTS 4,053,820 10/1977 Peterson et al. ................ 333/176 X
4,224,660 9/1980 Mohan .............................. 333/176 X
4,328,474 5/1982 Goodman et al. ................... 333/176

OTHER PUBLICATIONS

IEEE Transactions on Power Apparatus and Systems, vol. PAS-102, Sep. 1983, pp. 3107–3115.

Primary Examiner—Marvin L. Nussbaum
Attorney, Agent, or Firm—Kenyon & Kenyon

[57] ABSTRACT

For reducing the amount of circuitry and losses in double highpasses for filter arrangements in networks with a high voltage level, the two resonance frequencies and Q-factors of the double highpass are tuned so that in a critical harmonic range, at most a harmless slight resonance peak can occur, for which purpose a series capacitor together with a series choke are connected in series with a shunt circuit grounded, in the case of high voltage and ungrounded in the case of medium voltage, of ohmic, inductive and capacitive circuit elements connected to the network.

2 Claims, 1 Drawing Sheet

HIGHPASS FILTER OF A FILTER ARRANGEMENT FOR A THREE-PHASE NETWORK CONNECTED TO CONVERTERS

BACKGROUND OF THE INVENTION

The present invention relates to a highpass filter of a filter arrangement for a three-phase network connected to converters, having R, L and C sections for two harmonics.

From IEEE Transactions on Power Apparatus and Systems, vol. PAS 102, no. 9, September 1983, especially page 3209, a highpass for two characteristic 11th/13th-order harmonics is known.

For other than characteristic harmonics of adjacent order, additional tuned filter circuits or preferably, individual highpasses are often required for filtering harmonic currents at a high voltage level, which however, can often either not be operated or built economically in the necessary time for meeting the reactive power conditions, since the sum of-reactive power condition for the network cannot be met.

In addition, a point of parallel resonance occurs in the range of low-order harmonics of the second to about the fifth order between the network and the entire filter arrangement which, with a corresponding harmonic current, can result in excessive individual distortion in the voltage. However, excessive overvoltages can occur if the corresponding filter frequency coincides with the frequency of a harmonic. With low-order and low-power filters, the harmonic voltage can be limited to permissible values. For protection against additional stresses from the network, for instance, saturation and resonance phenomena when transformers are switched on, the filters must be overdesigned and optionally damped, increasing the losses. It is further a disadvantage that, as already mentioned, the required compensation power for low-order filter circuits for filtering the characteristic harmonics is not available.

SUMMARY OF THE INVENTION

It is an object of the present invention to decrease the cost and losses for the required highpasses and to dispense with separate filters for damping parallel resonances.

The above and other objects of the present invention are achieved by a highpass filter of a filter arrangement having R, L and C sections for two harmonics for a three-phase network connected to converters, comprising a C section, an L section and a shunt path comprising an R, L and C section, said C section, L section and shunt path being connected in series and further comprising an additional R section connected in shunt to a series circuit of the L section and the shunt path, said arrangement forming a double highpass filter tuned to any two different frequencies having two resonance frequencies and Q-factors such that due to the R-section in the shunt path, in a critical harmonic frequency range of low order, at most only a slight resonance peak between the network and the filter arrangement occurs, the R-section in the shunt path having a low loss for other frequencies.

In converter systems with filter circuits in networks with audio frequency powerline carrier systems, it is often necessary to employ additional separate frequency barriers for the audio frequencies.

In order to avoid such frequency barriers, the filters can be designed at least partially as double barriers, possibly eliminating damping resistors, where preferably the parallel resonance of the double highpass is placed as closely as possible to the respective audio frequency powerline carrier system.

BRIEF DESCRIPTION OF THE DRAWINGS

Two embodiments of a highpass filter arrangement according to the invention are schematically shown in the drawings wherein.

DETAILED DESCRIPTION

The reactive power Q for the fundamental to be supplied corresponds to $$Q \approx U^2 \cdot w \cdot C_R \tag{1}$$

where U is the line voltage and w the angular line frequency.

For high frequencies, the resultant capacity C is effective:

$$1/C = 1/C_R + 1/C_P \tag{2}$$

and thus, $$C = C_R C_P / (C_R + C_P) \tag{3}$$

The impedance Z is obtained as the minimum value $$Z_{min} = S/G \tag{4}$$

with S as the wave resistance and G as the quality of the resonant circuit.

Figure 1:
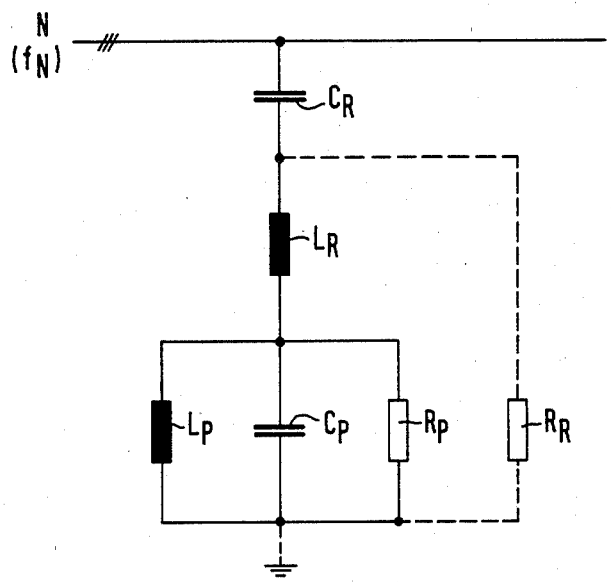
FIG. 1 is the schematic diagram of a highpass filter for a three-phase network without powerline carrier, where the resistor drawn dashed can be omitted in a network with powerline carrier operation, and for both cases, differently designed circuit elements are provided which must be designed according to the operating conditions schematically indicated in FIG. 2.
Figure 2:
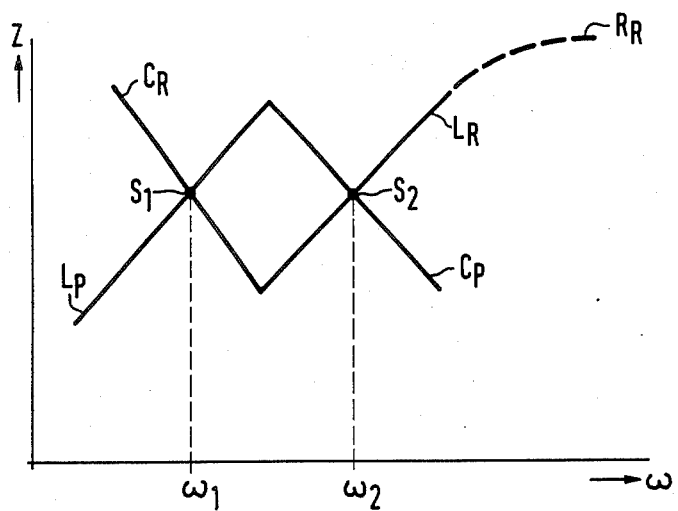
FIG. 2 shows the relationship between the respective angular frequency and the impedance Z in a logarithmic presentation.

By the highpass filter shown as a whole in FIG. 1 which is connected to a network N with the series capacitor $C_R$, the series choke $L_R$ and the resistor $R_R$ which is connected between them, is grounded for high voltage, is ungrounded for medium voltage and is supplemented by the correspondingly connected shunt members $L_P$, $C_P$, $R_P$, one obtains, simplified, for the partial characteristics determined by the circuit elements $C_R$ and $L_P$ on the one hand and the circuit elements $C_P$ and $L_R$ on the other hand, two wave resistances shown as the intersections in FIG. 2:

$$S_1 = 1/W_1 C_R - W_1 L_R \tag{5}$$

and $$S_2 = W_2 L_R - 1/W_2 C_R \tag{6}$$

The resistor $R_R$ lowers the slope of the impedance as a function of the angular frequency for higher frequencies. The circuit is designed so that in the critical harmonics range, at most one harmless, slight resonance peak can occur, which is accomplished by appropriate tuning of the two resonance frequencies and G-factors.

The calculation and layout can advantageously be accomplsighed by means of a suitable digital program.

The shunt resistor $R_P$ damps and operates with low loss for frequencies other than the angular resonance frequency $w_1$, $w_2$ and in particular, at the network frequency $f_N$.

For network operation with powerline carrier, the resistor $R_R$ can be omitted. The network parallel resonance for the powerline carrier frequency $f_{Rundst} \neq f_N$ is thus damped without detrimental effect on the rest of the operation.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A high pass filter of a filter arrangement for a three phase network having resistors, inductors and capacitors for two harmonics connected to converters connected to the network, said high pass filter comprising a first capacitor and a first inductor connected in series, said first capacitor and first inductor further connected in series with a shunt path comprising a first resistor, a second capacitor and a second inductor connected in parallel and further comprising a second resistor coupled across said first inductor and said shunt path, said high pass filter forming a double high pass filter tuned to any two different frequencies having two resonance frequencies and quality factors such that due to the first resistor in the shunt path, in a critical harmonic range of low order, at most only a slight resonance peak between the network and filter arrangement occurs, the first resistor in the shunt path having a low loss for other frequencies outside said critical harmonic frequency range of low order.

2. A highpass filter of a filter arrangement for a three-phase network having resistors, inductors and capacitors for two harmonics connected to converters connected to the network, the highpass filter comprising a first capacitor and a first inductor connected in series and further connected in series to a shunt path comprising a first resistor, a second inductor and a second capacitor connected in parallel, the high pass filter forming a double highpass filter tuned to any two different frequencies having two resonance frequencies and quality factors such that due to the first resistor in the shunt path, in a critical harmonic range of low order, at most only a slight resonance peak between the network and the filter arrangement occurs, the first resistor in the shunt path having a low loss for other frequencies outside a critical harmonic range of low order, said highpass filter being utilized in an audio frequency powerline carrier system, said double highpass tuned filter preferably tuned to at least one characteristic harmonic being tuned as to a parallel resonance thereof, such that trapping of the audio frequency is prevented, but harmonics of the converters are filtered.

* * * * *